United States Patent
Shuto

(10) Patent No.: US 7,046,542 B2
(45) Date of Patent: May 16, 2006

(54) SEMICONDUCTOR INTEGRATED CIRCUIT DEVICE

(75) Inventor: Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/875,307

(22) Filed: Jun. 25, 2004

(65) Prior Publication Data

US 2005/0152171 A1    Jul. 14, 2005

(30) Foreign Application Priority Data

Jan. 9, 2004    (JP)    ............... 2004-004555

(51) Int. Cl.
*G11C 11/22*    (2006.01)
(52) U.S. Cl. ................. 365/145; 365/230.06
(58) Field of Classification Search ............... 365/145, 365/230.06
See application file for complete search history.

(56) References Cited

U.S. PATENT DOCUMENTS

| 4,922,459 | A | | 5/1990 | Hidaka |
| 5,525,528 | A | * | 6/1996 | Perino et al. ................. 438/3 |
| 5,555,203 | A | | 9/1996 | Shiratake et al. |
| 6,449,182 | B1 | * | 9/2002 | Ooishi ........................ 365/63 |

* cited by examiner

*Primary Examiner*—M. Tran
(74) *Attorney, Agent, or Firm*—Oblon, Spivak, McClelland, Maier & Neustadt, P.C.

(57) ABSTRACT

A semiconductor integrated circuit device includes a plurality of memory cells which have two or more layout patterns and are arranged to make different patterns adjacent to each other, each of the memory cells having a transistor and a ferro-electric capacitor, a plurality of bit lines connected to the memory cells, and a plurality of sense amplifiers each of which is arranged in correspondence with a pair of bit lines connected to the memory cells having the same pattern and uses one of the pair of bit lines as a main input and the other of the pair of bit lines as an input complementary to the main input.

6 Claims, 6 Drawing Sheets

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2004-004555, filed Jan. 9, 2004, the entire contents of which are incorporated herein by reference.

BACKGROUND OF THE INVENTION

1. Field of the Invention

The present invention relates to a semiconductor integrated circuit device having a ferro-electric capacitor.

2. Description of the Related Art

Ferro-electric memories (FeRAM) using ferro-electric capacitors are recently receiving a great deal of attention as nonvolatile semiconductor memories. As a ferro-electric memory, a "Series connected TC unit type ferro-electric RAM" has been proposed. In this memory, the two terminals of a ferro-electric capacitor (C) are connected to the source and drain of a cell transistor (T) to form a unit cell. A plurality of unit cells are connected in series to form the "Series connected TC unit type ferro-electric RAM". As a ferro-electric memory read method, a "2T2C method" capable of ensuring a larger operation margin than a 1T1C method is receiving attention.

FIGS. 6 and 7 show the cell portion of a Series connected TC unit type ferro-electric RAM using the conventional 2T2C method.

In the conventional 2T2C method, adjacent bit lines serve as two complementary inputs of an operational sense amplifier. That is, as shown in FIGS. 6 and 7, when a bit line BL serves as the main input of an operational sense amplifier S/A, a bit line /BL adjacent to the bit line BL serves as an input complementary to the main input.

When the adjacent bit lines BL and /BL are used as the two complementary inputs, the layout around the sense amplifier S/A becomes simple. On the other hand, the adjacent bit lines BL and /BL interfere each other, resulting in a decrease in S/N ratio of a signal in a data read.

When offset-type cells are employed in this structure, they take an optimum cell layout as shown in FIG. 7 from the viewpoint of occupation area. More specifically, in the planar layout, memory cells connected to the adjacent bit lines BL and /BL are shifted in the horizontal direction on the drawing surface by a distance approximately corresponding to one cell, without being aligned. Due to this shift in the planar layout, two cell patterns which are paired and used for data comparison in the read differ.

For example, assume two adjacent memory cells connected to a single word line WL1. The two memory cells form a pair to be used for data comparison in the read. Of the two memory cells, one cell has an A-type pattern in which the upper electrode is connected to the bit line BL, and the lower electrode is connected to a plate line PL1. The other cell has a B-type pattern in which the lower electrode is connected to the bit line /BL, and the upper electrode is connected to a plate line PL2 (FIG. 3).

In a ferro-electric capacitor, generally, the hysteresis loop is sometimes asymmetrically shifted to the left or right side. This asymmetry is said to occur because, for example, the upper and lower electrodes are made of different materials, or the influence of damage caused during the ferro-electric memory manufacturing step differs between the interface of the upper electrode and that of the lower electrode. This phenomenon is generally called "initial imprint".

When the hysteresis loop is asymmetrical, the signal amount changes between the A-type cell having the upper electrode connected to the bit line BL and the B-type cell having the lower electrode connected to the bit line /BL. More specifically, in read-accessing the ferro-electric memory cells by the 2T2C method, the output from the A-type cell and that from the B-type cell enter the complementary inputs of the operational sense amplifier. If the signal amount for the same data changes between the two cells, the margin in the data read becomes small.

As described above, the conventional ferro-electric memory which uses the adjacent bit lines BL and /BL as the two complementary inputs of the sense amplifier S/A has the following problems.

(1) Since the adjacent bit lines BL and /BL interfere each other, the S/N ratio of a signal in the data read degrades.

(2) Since the pair of cells connected to the bit lines BL and /BL have different layout patterns, the margin in the data read becomes small.

The problems (1) and (2) are preferably avoided because they may decrease the yield or reliability of ferro-electric memories.

A prior art related to this application is, for example, U.S. Pat. No. 4,922,459.

BRIEF SUMMARY OF THE INVENTION

According to an aspect of the present invention, a semiconductor integrated circuit device comprises a plurality of memory cells which have not less than two layout patterns and are arranged to make different patterns adjacent to each other, each of the memory cells having a transistor and a ferro-electric capacitor, a plurality of bit lines connected to the memory cells, and a plurality of sense amplifiers each of which is arranged in correspondence with a pair of bit lines connected to the memory cells having the same pattern and uses one of the pair of bit lines as a main input and the other of the pair of bit lines as an input complementary to the main input.

DETAILED DESCRIPTION OF THE INVENTION

Figure 1:
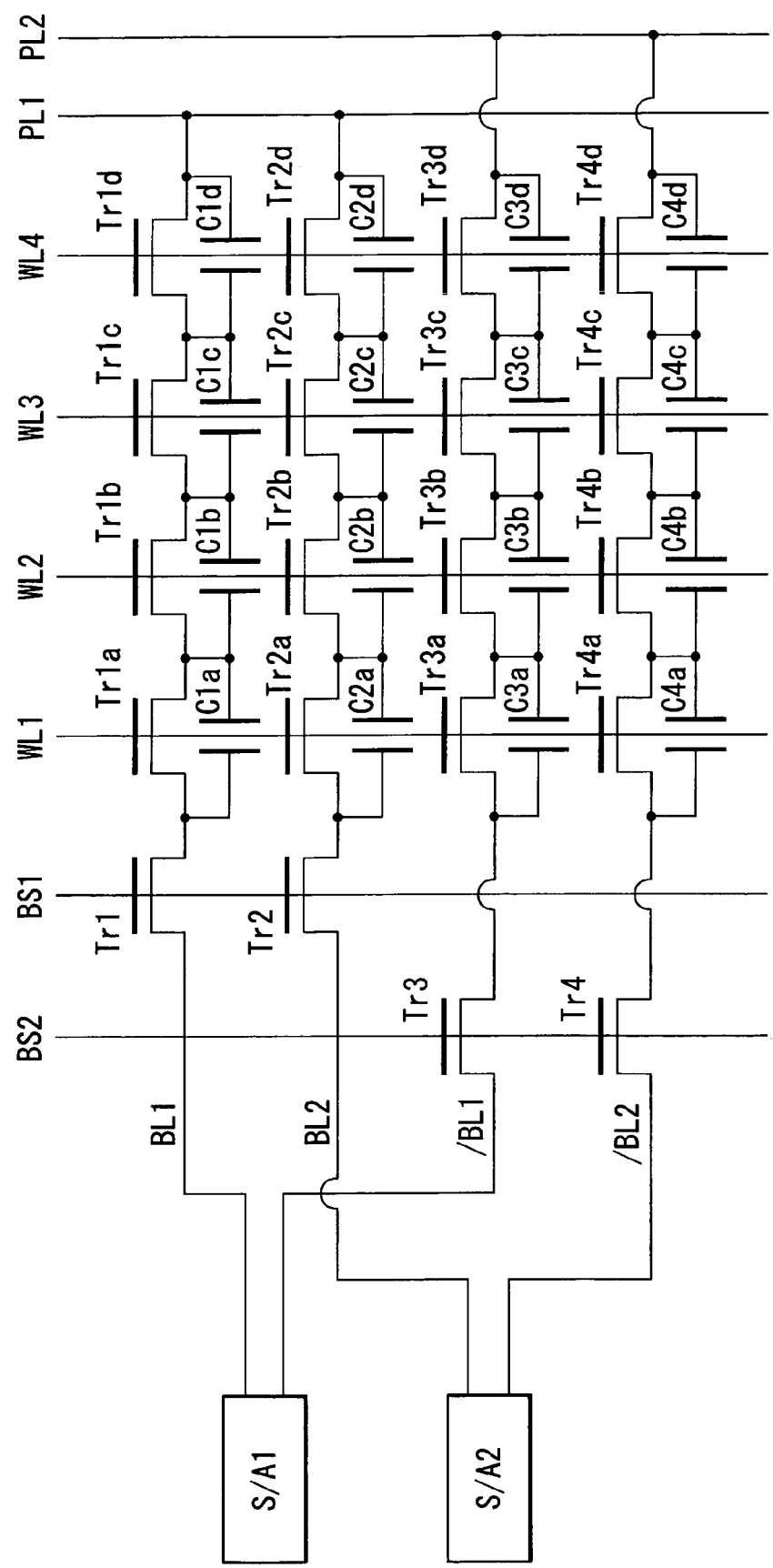
FIG. 1 is a circuit diagram showing the memory cell portion of a semiconductor integrated circuit device according to an embodiment of the present invention.

An embodiment of the present invention will be described below with reference to the accompanying drawing. In the following description, the same reference numerals denote the same parts throughout the drawing.

According to the embodiment of the present invention, in a ferro-electric memory (FeRAM) using a 2T2C method, to pair bit lines connected to cells having the same cell pattern as two complementary inputs to an operational sense amplifier, bit lines separated via several of those are used as a pair instead of using adjacent bit lines as a pair. More specifically, a Series connected TC unit type ferro-electric RAM using the 2T2C method will be exemplified.

FIG. 1 is a circuit diagram showing the memory cell portion of a semiconductor integrated circuit device according to an embodiment of the present invention. The structure of the Series connected TC unit type ferro-electric RAM using the 2T2C method will be described below with reference to FIG. 1.

A plurality of bit lines BL1, BL2, /BL1, and /BL2 and a plurality of word lines WL1, WL2, WL3, and WL4 are arranged in a matrix. A memory cell is arranged at each intersection of these lines.

Four memory cells connected to each of the bit lines BL1, BL2, /BL1, and /BL2 have a TC parallel unit series-connected structure.

For example, in the memory cells connected to the bit line BL1, the two terminals of a ferro-electric capacitor C1$a$ are connected to the source and drain of a transistor Tr1$a$. The two terminals of a ferro-electric capacitor C1$b$ are connected to the source and drain of a transistor Tr1$b$. The two terminals of a ferro-electric capacitor C1$c$ are connected to the source and drain of a transistor Tr1$c$. The two terminals of a ferro-electric capacitor C1$d$ are connected to the source and drain of a transistor Tr1$d$. The four cells are connected in series to form one cell group. One terminal of the cell group is connected to the bit line BL1 through a select transistor Tr1. The other terminal of the cell group is connected to a plate line PL1. The gates of the transistors Tr1$a$, Tr1$b$, Tr1$c$, and Tr1$d$ serve as the word lines WL1, WL2, WL3, and WL4.

Four memory cells connected to each of the bit lines BL2, /BL1, and /BL2 have the same structure as described above, and a description thereof will be omitted.

The two bit lines BL1 and /BL1 are connected to a sense amplifier S/A1. The two bit lines BL2 and /BL2 are connected to a sense amplifier S/A2. The bit line BL1 serves as the main input of the sense amplifier S/A1. The bit line /BL1 serves as an input complementary to the main input of the sense amplifier S/A1. Similarly, the bit line BL2 serves as the main input of the sense amplifier S/A2. The bit line /BL2 serves as an input complementary to the main input of the sense amplifier S/A2.

In this Series connected TC unit type ferro-electric RAM using the 2T2C method, the memory cells have two layout patterns. The layout patterns of memory cells will be described below with reference to FIGS. 2 and 3.

Figure 2:
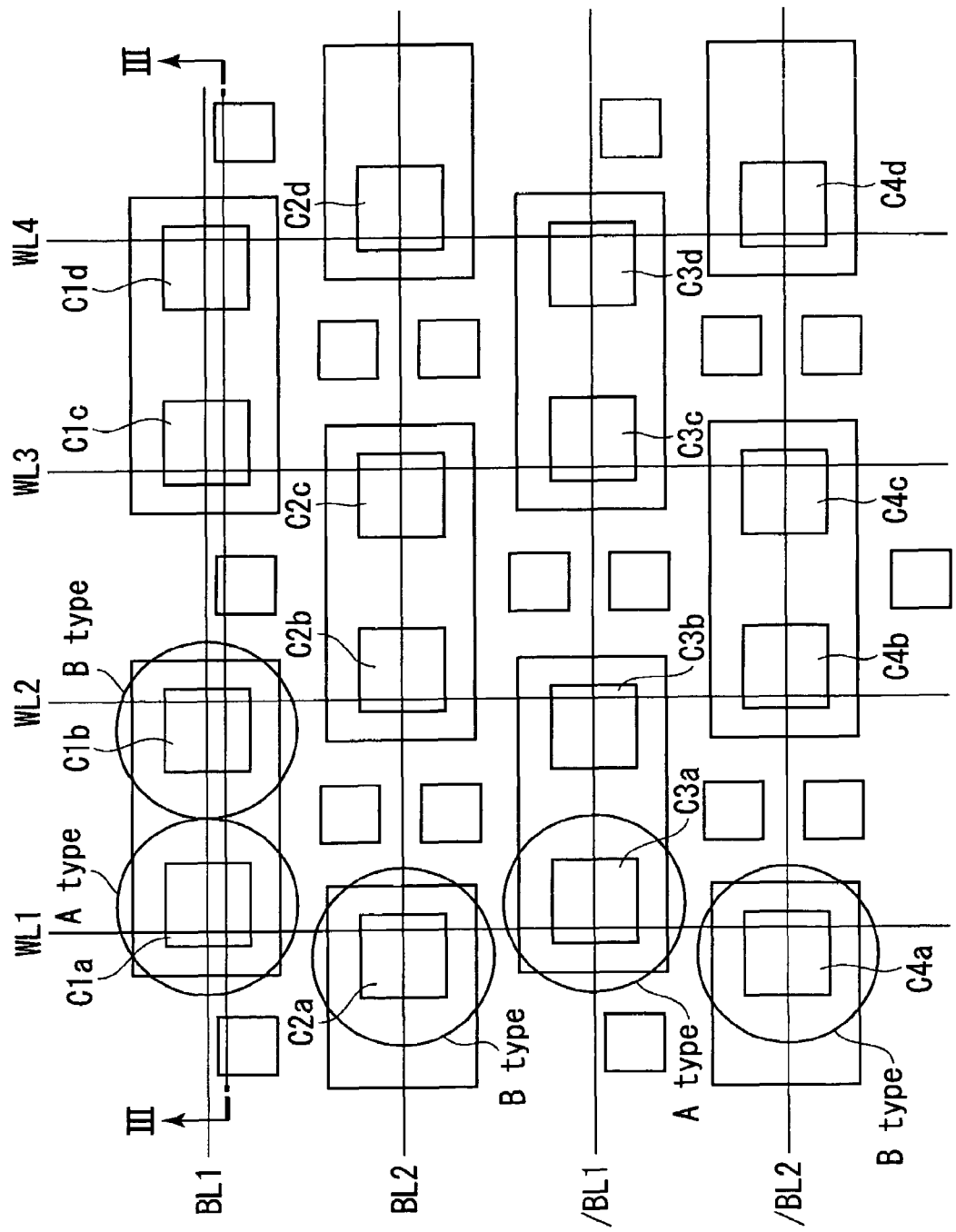
FIG. 2 is a plan view showing the memory cell portion of the semiconductor integrated circuit device according to the embodiment of the present invention.
Figure 3:
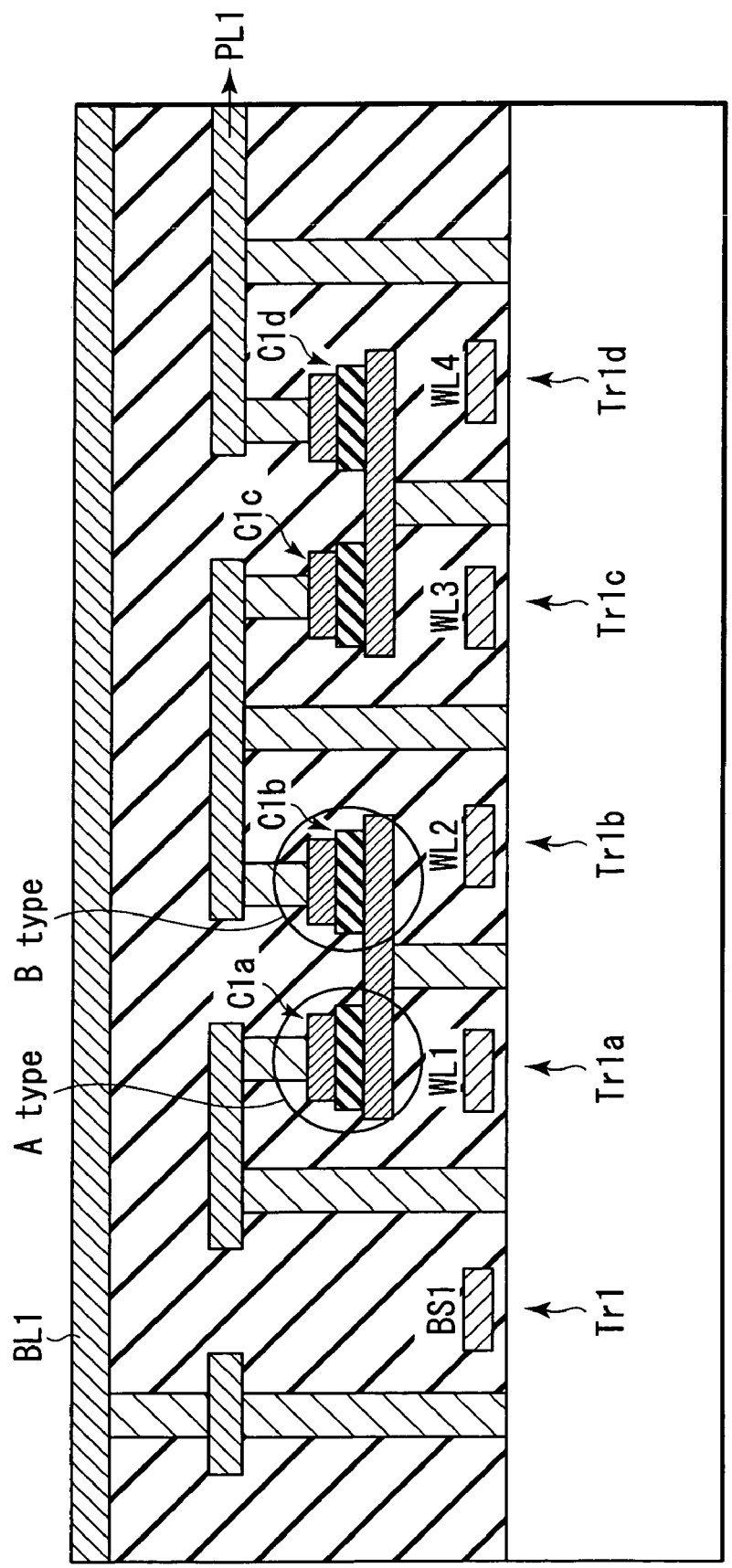
FIG. 3 is a sectional view of the memory cell portion taken along a line III—III in FIG. 2.

In the structure shown in FIGS. 2 and 3, a memory cell has either the A-type pattern or the B-type pattern. Memory cells connected to the bit line BL1 will be exemplified. In the A-type pattern, the upper electrode of the ferro-electric capacitor C1$a$ is connected to the bit line BL1. The lower electrode of the ferro-electric capacitor C1$a$ is connected to the plate line PL1. On the other hand, in the B-type pattern, the upper electrode of the ferro-electric capacitor C1$b$ is connected to the plate line PL1. The lower electrode of the ferro-electric capacitor C1$b$ is connected to the bit line BL1. That is, in the A- and B-type patterns, a bit line BL and plate line PL connected to the electrodes of a ferro-electric capacitor C are reversed.

Assume cells using the word line WL1. As shown in FIG. 2, the ferro-electric capacitor C1$a$ has the A-type pattern. A ferro-electric capacitor C2$a$ has the B-type pattern. A ferro-electric capacitor C3$a$ has the A-type pattern. A ferro-electric capacitor C4$a$ has the B-type pattern. That is, in cells using the same word line, ferro-electric capacitors with the two different A- and B-type patterns alternate to be adjacent to each other. Hence, the sense amplifier S/A1 has, as its two complementary inputs, the bit lines BL1 and /BL1 connected to the cells having the same A-type pattern. The sense amplifier S/A2 has, as its two complementary inputs, the bit lines BL2 and /BL2 connected to the cells having the same B-type pattern.

In the above-described embodiment of the present invention, two bit lines connected to memory cells having the same pattern are paired. One of the pair of bit lines is used as the main input of the sense amplifier. The other bit line is used as the input complementary to the main input.

In the structure shown in FIGS. 1 to 3, the A- and B-type memory cells are alternately arranged on each of the word lines WL1, WL2, WL3, and WL4. The bit line serving as the main input to the sense amplifier has, as its complementary input, the second bit line ahead of it. That is, the bit line BL2 connected to the sense amplifier S/A2 different from the sense amplifier S/A1 is present between the bit lines BL1 and /BL1 connected to the sense amplifier S/A1. The bit line /BL1 connected to the sense amplifier S/A1 different from the sense amplifier S/A2 is present between the bit lines BL2 and /BL2 connected to the sense amplifier S/A2. A bit line BL$n$ ($n$=1, 2, 3, . . . ) serving as the main input to a sense amplifier S/A$n$ is not adjacent to a bit line /BL$n$ serving as the input complementary to the main input.

Figure 4:
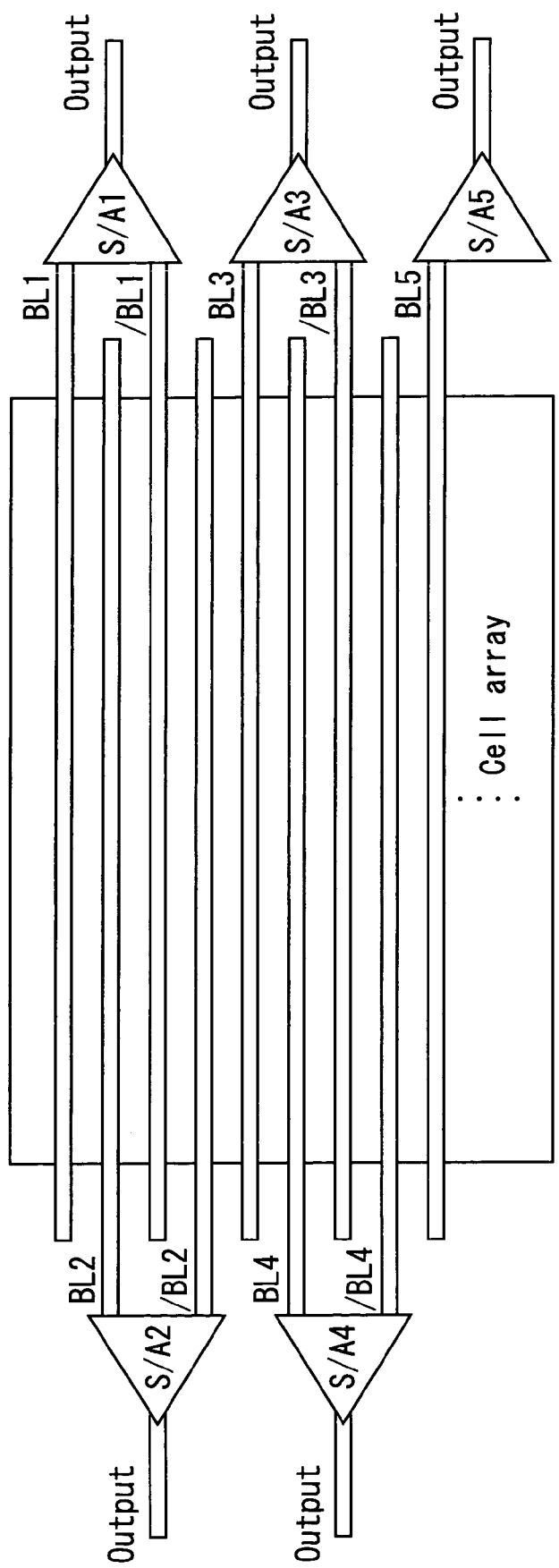
FIG. 4 is a schematic view showing the sense amplifiers of the semiconductor integrated circuit device according to the embodiment of the present invention.

FIG. 4 shows the layout of sense amplifiers when bit line pairs have the above-described layout. As shown in FIG. 4, the plurality of bit lines BL$n$ and /BL$n$ ($n$=1, 2, 3, . . . ) run across the cell array formed from a plurality of cells. The two ends of the bit lines BL$n$ and /BL$n$ are present outside the cell array. The sense amplifier S/A$n$ arranged on one end side (e.g., the right side of the drawing surface) of the pair of bit lines BL$n$ and /BL$n$ and the sense amplifier S/A$n$ arranged on the other end side (e.g., the left side of the drawing surface) alternate.

For example, when the row number $n$ of the pair of the bit lines BL$n$ and /BL$n$ is an odd number, the sense amplifier S/A$n$ is arranged on the right side of the page. When the row number $n$ of the pair of the bit lines BL$n$ and /BL$n$ is an even number, the sense amplifier S/A$n$ is arranged on the left side of the page.

According to the embodiment of the present invention, when a plurality of cell patterns are present, a bit line pair connected to the same cell pattern are used as two complementary inputs to an operational sense amplifier. With this arrangement, the following effects (1) to (4) can be obtained, unlike the conventional ferro-electric memory, so that the yield and reliability of ferro-electric memories can be increased.

(1) According to the embodiment of the present invention, cells connected to the pair of bit lines BL and /BL have the same pattern (same layout and same structure). Since the difference of signal amount for the same data can be suppressed between the pair of two cells, the margin in the data read can be increased.

(2) According to the embodiment of the present invention, the same pattern layout is repeated for every other bit line. That is, since an optimum cell layout is employed from the viewpoint of occupation area, the area per unit cell can be minimized.

(3) According to the embodiment of the present invention, the bit line BL serving as the main input to the sense amplifier is paired with the bit line /BL while interposing another bit line between them. Since interference between the signals of the bit lines BL and /BL dose not occur, the S/N ratio in the read can be increased.

In read-accessing cells connected to the pair of bit lines BL and /BL, a voltage of, e.g., Vcc/2 is applied to another bit line that is present between the pair of bit lines BL and /BL. In this case, the S/N ratio is expected to be higher.

(4) According to the embodiment of the present invention, the sense amplifiers are arranged as shown in FIG. 4. Even when bit lines that are not adjacent are paired, the layout around the sense amplifiers can be simplified.

The present invention is not limited to the above embodiment, and various changes and modifications can be made without departing from the spirit and scope of the present invention.

For example, two or more cell patterns may be used. When n patterns are employed, for example, (n−1) excess bit lines are arranged between the pair of bit lines BL and /BL.

In the TC parallel unit series-connected structure, the number of cells connected to one bit line is not limited to four.

Figure 5:
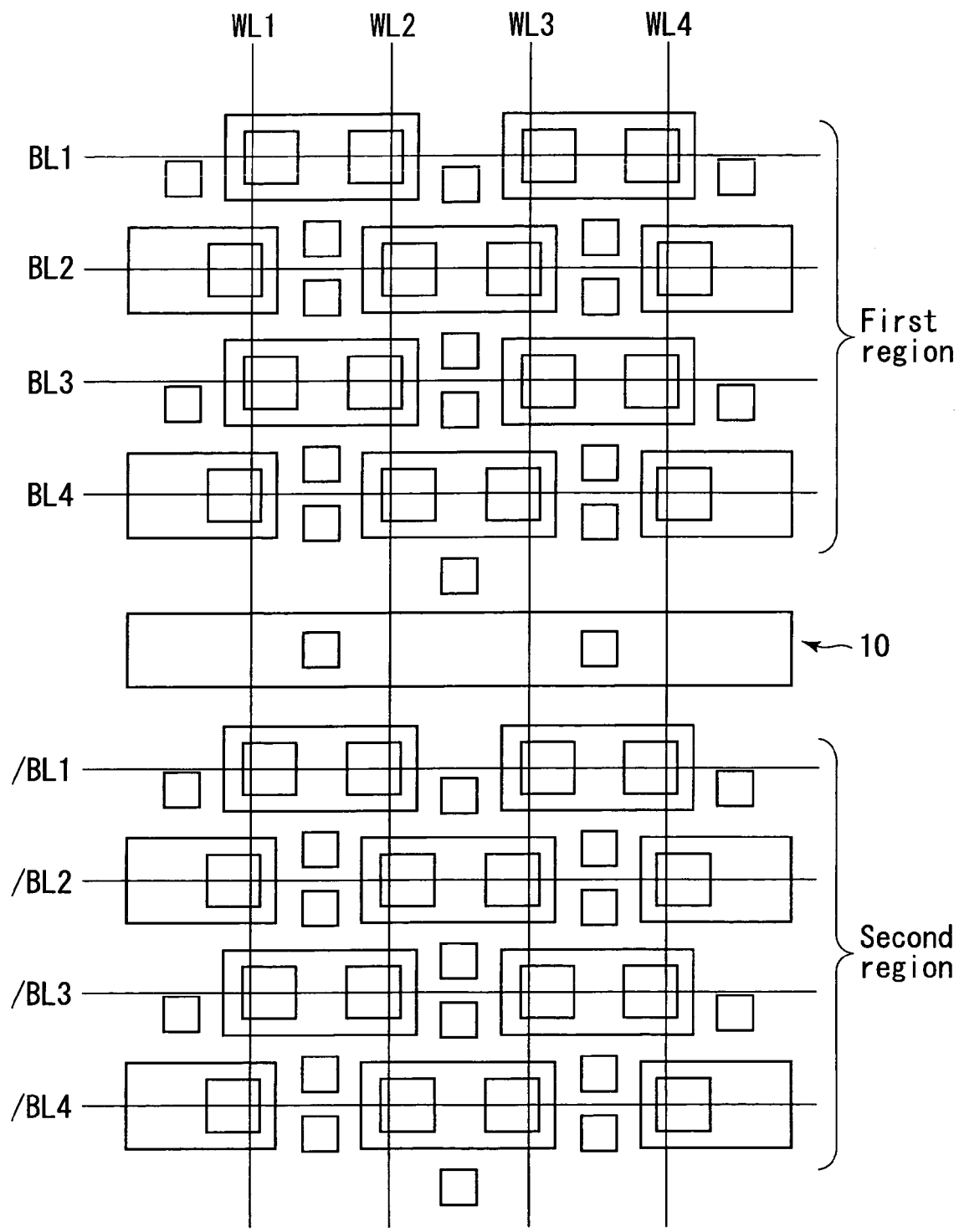
FIG. 5 is a plan view showing another memory cell portion of the semiconductor integrated circuit device according to the embodiment of the present invention.
Figure 6:
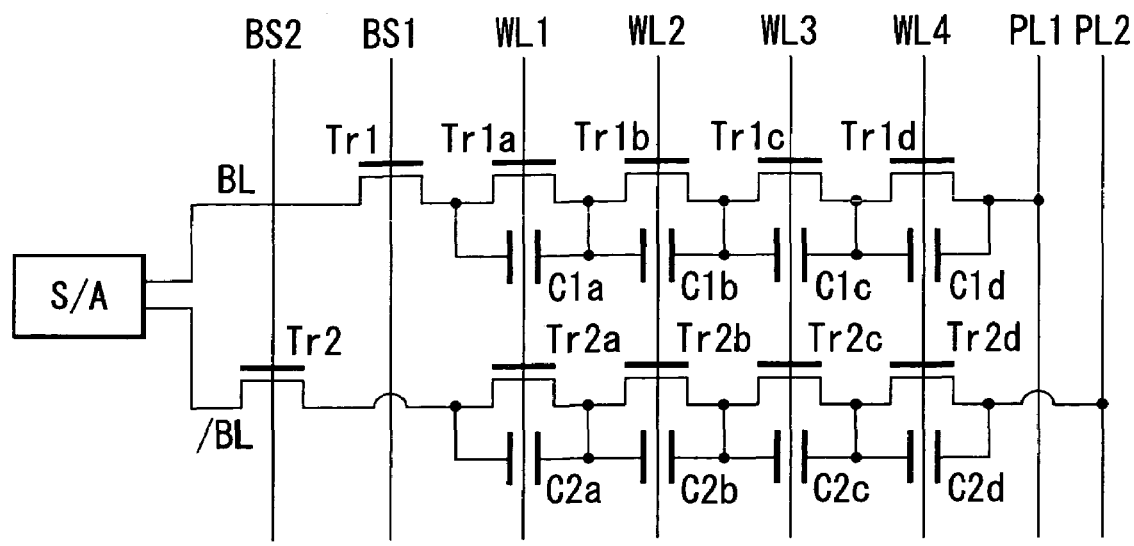
FIG. 6 is a circuit diagram showing the memory cell portion of a conventional semiconductor integrated circuit device.
Figure 7:
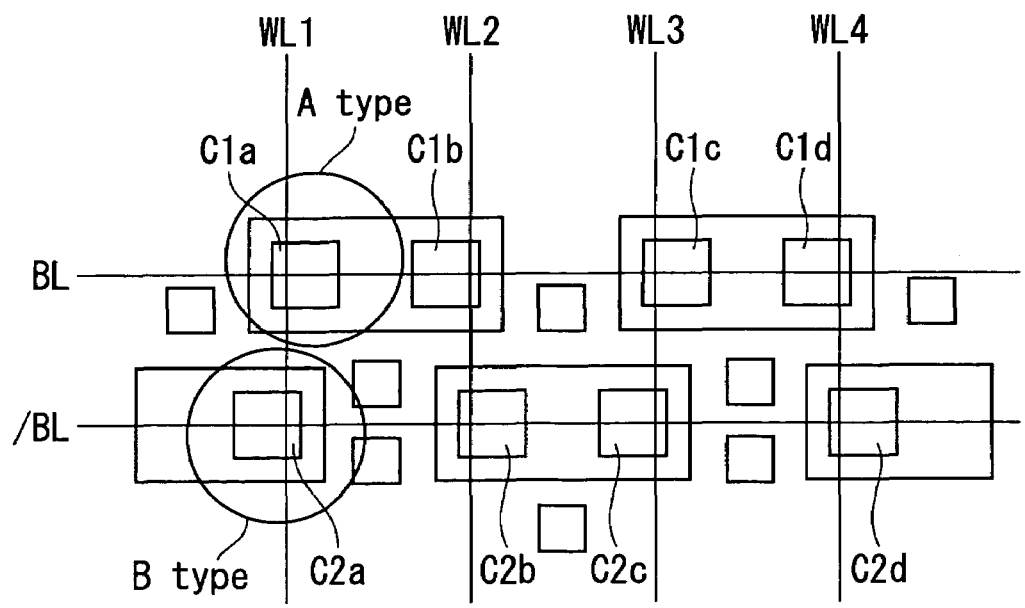
FIG. 7 is a plan view showing the memory cell portion of the conventional semiconductor integrated circuit device.

In the structure shown in FIG. 2, a pattern formed from eight cells connected to the bit lines BL1 and BL2 are regarded as a group, and the pattern is repeated every eight cells. However, the present invention is not limited to this. For example, as shown in FIG. 5, bit lines BL1, BL2, BL3, and BL4 serving as the main inputs to the sense amplifiers are arranged in the first region. Bit lines /BL1, /BL2, /BL3, and /BL4 serving as inputs complementary to the main inputs of the sense amplifiers are arranged in the second region. A well contact region 10 is formed between the first and second regions. In this way, the pattern may be repeated every 16 cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a plurality of memory cells which have not less than two layout patterns and are arranged to make different patterns adjacent to each other, each of the memory cells having a transistor and a ferro-electric capacitor;
a plurality of bit lines each of which is connected in correspondence with the memory cells;
a plurality of sense amplifiers each of which is arranged in correspondence with a pair of bit lines connected to the memory cells having the same pattern and uses one of the pair of bit lines as a main input and the other of the pair of bit lines as an input complementary to the main input; and
a plurality of plate lines each of which is connected in correspondence with a group of memory cells having the different patterns.

2. A device according to claim 1, wherein the memory cells include first memory cells having a first pattern and second memory cells having the same pattern different from the first pattern,
the first memory cell having
a first bit line,
a first plate line, and
a first ferro-electric capacitor which has a first upper electrode connected to the first bit line and a first lower electrode connected to the first plate line, and
the second memory cell having
a second bit line,
a second plate line, and
a second ferro-electric capacitor which as a second upper electrode connected to the second plate line and a second lower electrode connected to the second bit line.

3. A device according to claim 1, wherein each of the memory cells has a structure in which two terminals of the ferro-electric capacitor are connected to a source and drain of the transistor to form a unit cell, and a plurality of unit cells are connected in series.

4. A device according to claim 1, wherein the sense amplifiers have a first sense amplifier arranged on one end side of the pair of bit lines and a second sense amplifier arranged on the other end side of the pair of bit lines, and outside a cell array formed from the memory cells, the first sense amplifier and the second sense amplifier alternate.

5. A device according to claim 1, wherein the memory cells which are arranged to make the different patterns adjacent to each other use a same word line.

6. A device according to claim 1, wherein when the number of types of the layout patterns in n, and (n−1) bit lines which are different from the pair of bit lines are arranged between the pair of bit lines.

* * * * *